United States Patent
LaPlante et al.

(10) Patent No.: US 6,823,585 B2
(45) Date of Patent: Nov. 30, 2004

(54) METHOD OF SELECTIVE PLATING ON A SUBSTRATE

(75) Inventors: Mark J. LaPlante, Montgomery, NY (US); Jon A. Casey, Poughkeepsie, NY (US); Thomas A. Wassick, Lagrangeville, NY (US); David C. Long, Wappingers Falls, NY (US); Krystyna W. Semkow, Poughquag, NY (US); Patrick E. Spencer, Rochester, NY (US); Robert A. Rita, Manlius, NY (US); Richard F. Indyk, Wappingers Falls, NY (US); Kathleen M. Wiley, Wappingers Falls, NY (US); Brian R. Sundlof, Beacon, NY (US); James Balz, Walden, NY (US); Lori A. Maiorino, Wappingers Falls, NY (US); Donald R. Wall, Poughkeepsie, NY (US); Glenn A. Pomerantz, Kerhonkson, NY (US)

(73) Assignee: International Business Machines Corporation, Armonk, NY (US)

(*) Notice: Subject to any disclaimer, the term of this patent is extended or adjusted under 35 U.S.C. 154(b) by 40 days.

(21) Appl. No.: 10/249,305
(22) Filed: Mar. 28, 2003
(65) Prior Publication Data
US 2004/0187303 A1 Sep. 30, 2004

(51) Int. Cl.[7] ............................................. H01R 43/00
(52) U.S. Cl. ............................. 29/825; 29/830; 29/846; 29/847; 29/848; 29/851; 29/852; 29/855; 29/856; 29/402.09; 29/402.03; 29/402.13; 29/402.18
(58) Field of Search .................... 29/603.14, 603.07, 29/603.15, 603.18, 603.25, 825, 830, 846, 847, 848, 851, 852, 855, 856, 402.03, 402.13, 402.18; 216/61, 62, 65, 66; 219/121.69, 121.71; 427/96.1, 96.2, 304, 131; 205/125, 126; 204/298.1

(56) References Cited

U.S. PATENT DOCUMENTS

| | | | |
|---|---|---|---|
| 4,182,781 A | 1/1980 | Hooper et al. ................ 427/90 |
| 4,692,349 A | 9/1987 | Georgiou et al. ........... 437/230 |
| 4,794,093 A | 12/1988 | Tong et al. ................ 437/203 |
| 5,084,299 A * | 1/1992 | Hirsch et al. ............... 427/556 |
| 5,108,825 A * | 4/1992 | Wojnarowski et al. ...... 428/209 |
| 5,111,278 A * | 5/1992 | Eichelberger ............... 257/698 |
| 5,158,860 A | 10/1992 | Gulla et al. ................. 430/315 |
| 5,497,033 A * | 3/1996 | Fillion et al. ............... 257/723 |
| 5,748,417 A * | 5/1998 | Malhotra et al. ........... 360/126 |
| 5,815,909 A * | 10/1998 | Gray ........................ 29/603.14 |
| 6,014,809 A | 1/2000 | Sebesta ....................... 29/896 |
| 6,069,015 A * | 5/2000 | Gray et al. .................... 438/3 |
| 6,140,234 A | 10/2000 | Uzoh et al. ................. 438/678 |
| 6,251,781 B1 | 6/2001 | Zhou et al. ................. 438/687 |
| 6,251,797 B1 | 6/2001 | Nishimura .................. 438/745 |
| 6,287,968 B1 | 9/2001 | Yu et al. ..................... 438/675 |
| 6,319,834 B1 | 11/2001 | Erb et al. .................... 438/687 |

* cited by examiner

*Primary Examiner*—Peter Vo
*Assistant Examiner*—Tai Nguyen
(74) *Attorney, Agent, or Firm*—James J. Cioffi (57) ABSTRACT

A method and structure to form surface plating metallization on a substrate. Two layers of tape are applied to the surface of the substrate. A first path is cut through both layers of tape exposing the substrate surface. The first path connects at least one conductive via on the top surface of the substrate. A second path is cut through the second layer of tape exposing the first layer of tape. The second path is routed from the first path to an edge of the substrate A seed layer is deposited over the surface of the second layer of tape thereby creating a seeded plating path in the first path and a sacrificial seeded conduction path in the second path. Connecting the sacrificial seeded conduction path to a plating potential at the edge of the substrate creates a plated path on the surface of the substrate. The sacrificial path is removed when the tape is removed.

13 Claims, 12 Drawing Sheets

METHOD OF SELECTIVE PLATING ON A SUBSTRATE

CROSS REFERENCE TO RELATED APPLICATIONS

This application is related to subject matter described and claimed in U.S. patent application Ser. No. 10/358,431 entitled Electronic Package Repair Process, both by the inventors of the instant application and filed on Feb. 4, 2003.

BACKGROUND OF INVENTION

The present invention is directed to electronic packaging in general, and specifically, a method to form additional surface plating metallization on post-fired MLC substrates.

The present invention has been developed as an alternative to current thin-films repair approaches currently used in the electronic packaging industry. The present invention is also an alternative to the related application referenced above, where a laser beam is used to form a trench on a lapped substrate defining the path of a desired repair conductor from an isolated defective net via to an alternate repair net via. Once the trench is formed, a seed layer is sputtered or evaporated, covering at least a portion of the surface of the substrate and subsequently the bottom and sides of the laser formed trench. The trench is then completely filled by either continued sputtering of the desired metallurgy, or alternately, electroplated. The substrate is then lapped and polished to remove the metallurgy on the surface of the substrate exposing just the repair conductor metallurgy in the now filled trench.

A requirement of the related process is that the substrate must be planarized. This presents several necessary process steps and may introduce other defects which must be addressed. Attempts to create a repair path by using a lift-off mask on non-planar substrates have been unsuccessful. In these methods, a lift-off mask would be placed on the substrate and the laser trench formed through it to expose the substrate surface. The lift-off mask would be left in place when the substrate is seeded and the trench filled with the conductor metallurgy. The lift-off mask, which must now be removed, is completely covered and is fully attached to the repair metallurgy. Removal is now difficult and may introduce undesirable defects to the repair area.

The present invention addresses a means to repair an electrical conductor on a non-planar substrate without the above difficulties. A dual in-situ lift-off mask is disclosed as a means to post-fire personalize Multi-Layer Ceramic (MLC) substrates. The disclosed method can be used as a means to form additional Top Surface Metallization (TSM) wiring used for Engineering Changes (EC's) or repair of internal wiring defects on planar and non-planar substrates. This process has been developed as an alternative to the thin-film repair approach currently used in the manufacture of MLC substrates.

These and other purposes of the present invention will become more apparent after referring to the following description considered in conjunction with the accompanying drawings.

SUMMARY OF INVENTION

The purposes and advantages of the present invention have been achieved by providing a method to form surface plating metallization on a substrate comprising the steps of: providing a substrate having a top surface and a bottom surface and a plurality of conductive vias providing electrical connections between the top and bottom surface and between top surface vias; applying a first layer of tape on the top surface; applying a second layer of tape on the first layer of tape; creating a first path through both the first layer of tape and the second layer of tape, to expose a portion of the top surface, the first path contacting at least one conductive via on the top surface; creating a second path through the second layer of tape to expose a portion of the first layer of tape and intersecting with the first path wherein the second path is connected from the first path to an edge of the substrate; depositing a seed layer over the surface of the second layer of tape to create a seeded plating path in the first path and a sacrificial seeded conduction path in the second path intersecting with the seeded plating path; removing the second layer of tape while maintaining a seeded plating path in the first path and a sacrificial seeded conduction path on the surface of the first layer of tape; connecting the sacrificial seeded conduction path to a plating potential at the edge of the substrate; immersing the substrate in a plating solution and applying current through the sacrificial seeded conduction path to plate the seeded plating path; and removing the first layer of tape to remove the sacrificial seeded conduction path and uncovering a selectively plated substrate surface.

The method may further comprise the steps of: applying a third layer of tape over the sacrificial seeded conduction path prior to plating such that only the ends of said sacrificial seeded conduction path are exposed to prevent the bulk of the sacrificial seeded conduction path from plating.

In a preferred embodiment the first and second paths are formed by laser ablation. The laser power may also be increased such that the laser ablation also forms a trench in the top surface of the substrate coinciding with the first path.

The present invention also provides a method to repair a defective electrical connection in a substrate comprising the steps of: providing a substrate having a top surface and a bottom surface and a plurality of conductive vias providing electrical connections between the top and bottom surface; applying a first layer of tape on the top surface; applying a second layer of tape on the first layer of tape; laser ablating an opening in both the first and second tape layers over a defective via; etching the defective via to create a void to a desired depth; filling the void with an insulating material to electrically isolate the defective via; laser ablating a first path through both the first layer of tape and the second layer of tape to expose a portion of the top surface, the first path connecting the isolated defective via to a repair via on the top surface; laser ablating a second path through the second layer of tape to expose a portion of the first layer of tape and intersecting with the first path wherein the second path is routed from the first path to an edge of the substrate; depositing a seed layer over the surface of the second layer of tape to create a seeded plating path in the first path and a sacrificial seeded conduction path in the second path intersecting with the seeded plating path; removing the second layer of tape while maintaining a seeded plating path in the first path and a sacrificial seeded conduction path on the surface of the first layer of tape; connecting the sacrificial seeded conduction path to a plating potential at the edge of the substrate; immersing the substrate in a plating solution and applying current through the sacrificial seeded conduction path to plate the seeded plating path; and removing the first layer of tape to remove the sacrificial seeded conduction path and uncovering a selectively plated repair path on the substrate surface.

The present invention also provides a surface plating metallization structure comprising: substrate having a top surface and a bottom surface and a plurality of conductive vias providing electrical connections between said top and bottom surface; a first layer of tape on the top surface; a second layer of tape on the first layer of tape; a first path through both the first layer of tape and the second layer of tape exposing a portion of the top surface, the first path contacting at least one conductive via on the top surface; a second path through the second layer of tape exposing a portion of the first layer of tape and intersecting with the first path wherein the second path is connected from the first path to an edge of the substrate; and a seeded plating path in the first path and a sacrificial seeded conduction path in the second path and on the surface of the first layer of tape.

The surface plating metallization structure may further comprise a third layer of tape over the sacrificial seeded conduction path such that only the ends of the sacrificial seeded conduction path are exposed to prevent the bulk of the sacrificial seeded conduction path from plating.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed descriptions which follows taken in conjunction with the accompanying drawings in which:

DETAILED DESCRIPTION

The purposes of the present invention have been achieved by providing, according to the present invention, a dual in-situ mask as a means to post-fire personalize an MLC substrate. Typical MLC substrates contain electrical wiring which interconnection the top and bottom of the substrate as well as providing electrical interconnections between top surface vias. This electrical interconnection typically consists of vertical columns of conductive metal commonly referred to as "vias". Horizontal conductive lines or nets in turn connect to the vias. The disclosed method can be used as a means to aid in the formation of additional top surface metal "TSM" wiring or engineering changes "EC's" or repair of internal wiring on both planar and non-planar substrates.

Conventional repair technology currently used on MLC substrates is accomplished primarily by means of thin-film repair processes. These are primarily photo processes which can only be performed on substrates which already possess thin film wiring on the top surface of the substrate or substrates which can have the thin films added for repair reasons. Thin film processes are very costly, involving numerous expensive and complicated tools and processes to accomplish a repair.

The present invention is a low-cost alternative method to form repair or EC structures on a substrate using a pattern formed by a laser in at least two removable and disposable tape masks. By using an in-situ mask formed by a laser, most of the expensive tools and processes normally applied to form a thin-film repair (such as applying a photo resist, expose, develop, strip, etc.) can be eliminated, thereby reducing the cost and time consuming process steps. Additionally, the tape mask serves to protect the substrate surface during handling and processing resulting in reduced risk of damage.

A first embodiment of the current invention is applicable where it is desired to repair a defective net on a substrate. Two layers of commercially available protective tape are applied over the entire top surface of the substrate. Although it is only necessary to cover the top of the substrate, it may be advantageous to cover the bottom surface with a layer of tape as a protective means. In a preferred embodiment the tape used is a transparent polyester film with a rubber adhesive having a total thickness of 0.0014 inches (#336 manufactured by 3M). This tape is water resistant and is also resistant to a variety of chemicals such as nitric acid. The tape has a very low-tack adhesive and has a high temperature stability. It can also be cleanly and completely ablated by a laser beam, making it ideally suited to this application. Although the tape currently used is a transparent polyester film with a rubber adhesive of total thickness of 0.0014 inch (#336 manufactured by 3M), any suitable tape or removable coating may be used.

A tightly focused UV laser beam is first used to ablate both layers of tape over the via connected to the defective net. In a preferred embodiment the fourth harmonic of a Nd-YAG laser with a wavelength of 0.266 $\mu$m was used. The fluence of the laser is adjusted so that it ablates the tape but does not affect the underlying ceramic substrate or metallurgy. An acid solution is subsequently applied to the ablated area over the via, dissolving a portion of the metallurgy to below the surface. An electrically insulating material may then be applied to the removed via to ensure electrical isolation of the defective net if desired.

The laser beam is then again used to ablate a path completely through both of the tape layers from this now isolated via to a good repair net via through which metal can be deposited. The laser fluence is then reduced such that it takes several passes to ablate fully through a layer of tape. A second path is then formed in only the top layer of tape so that it is fully removed and only partially formed in the lower layer. This path is routed from an arbitrary point along the repair path to a portion of the edge of the substrate. Seed metallurgy is then sputtered or evaporated over the surface of the top mask and into the openings formed by the laser.

The upper layer of tape is now removed resulting in a seeded repair path and a sacrificial seeded conduction path which is used for connecting the repair path to the electroplating potential. If desired, an additional new piece of tape can be applied over this sacrificial line leaving just its ends exposed, preventing the bulk of the line length from plating-up. The substrate is now electroplated by connecting the end of the sacrificial conductor, routed to the edge of the substrate, to the plating potential, immersing the substrate in a plating solution, and applying current through the sacrificial seeded conduction path. The current, typically microamps, is conducted through this path through the sputtered seed layer to the repair path wherein only the repair path will plate-up.

Since the second path is formed only on the surface of the first layer of tape and could be of very thin dimensions, and may optionally be covered by an additional layer of tape to prevent plating, only a small area of this line will plate up. This allows the first layer of tape to easily be removed, along with the sacrificial conductor, without pulling the desired repair metallurgy off of the repair site. The resulting repair conductor can then be further processed (i.e., electrical passivation or gold plated) as desired to complete the repair.

A second embodiment of the present invention involves the above process without the acid etching of vias to form an EC wire. A third embodiment of the present invention involves the above process where after acid etching of the defective net via, the laser fluence is increased so that as the tape is ablated over the desired path, a portion of the underlying ceramic is also removed to form a trench in the ceramic substrate surface. Metallization and tape mask removal can then be done in the same manner as in the first embodiment. Forming a trench in the surface of the substrate allows the new metallization to be thicker without increasing its height above the surface of the substrate, ensuring adequate conductance of the metal line while maintaining low line height. Forming a trench also allows for planarization of the substrate following metallization if desired whereby the upper surface of the metal conductor after planarization is flush with the substrate surface.

In a fourth embodiment of the present invention, the sacrificial conductor line is connected to a repair net via and after seeding, is completely over-coated with an additional layer of protective tape. The repair net via would then be connected to the plating potential through the preexisting internal wiring within the substrate to provide a conductive path during plate-up. This would prevent any portion of the sacrificial conductor line to plate-up at the repair site, reducing even further any likelihood of the repair conductor being pulled out of the repair site during tape lift-off.

Figure 1:
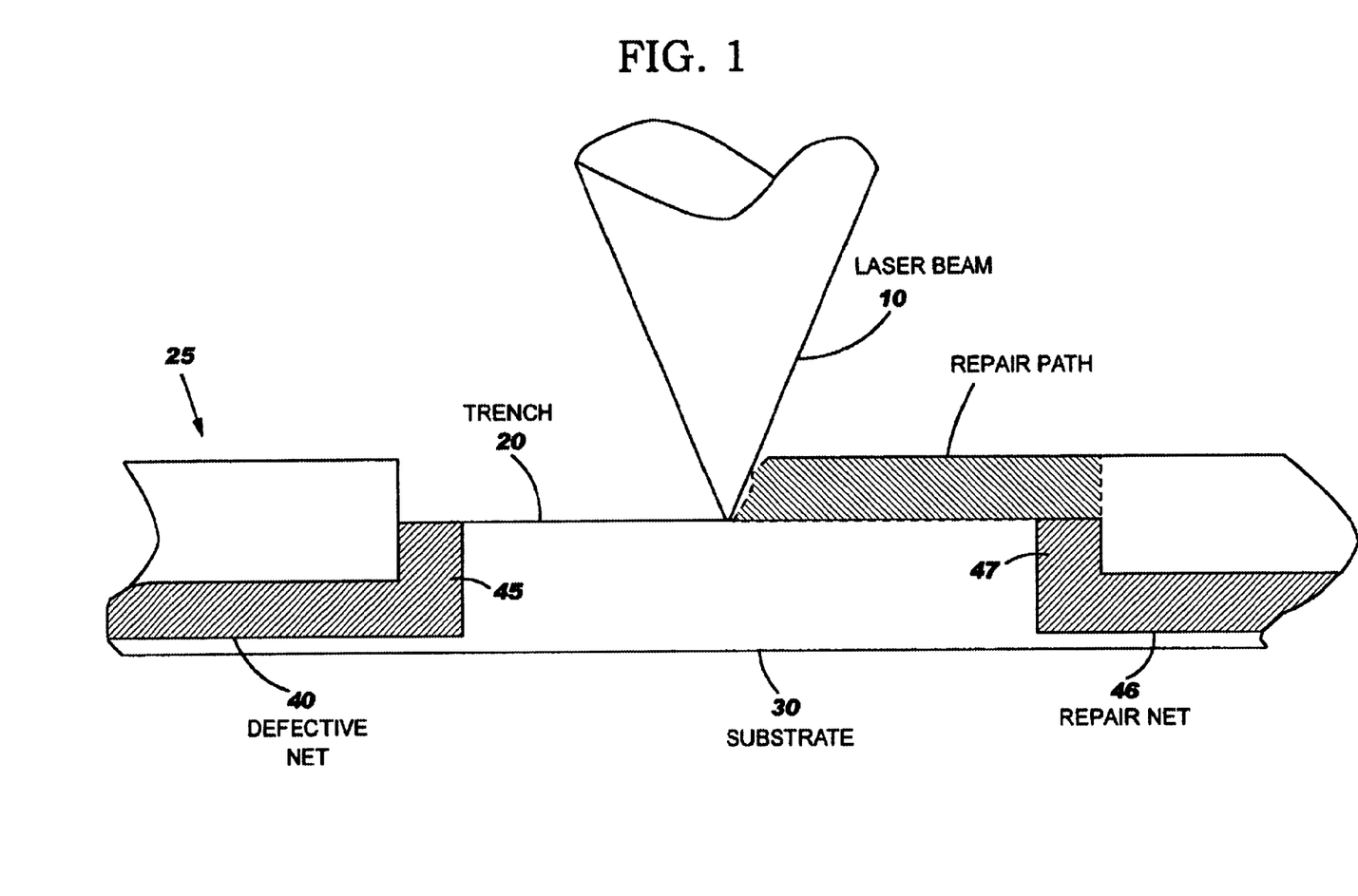
FIG. 1 is an enlarge, partial cross-sectional view of a substrate illustrating laser ablation of a repair path.
Figure 2:
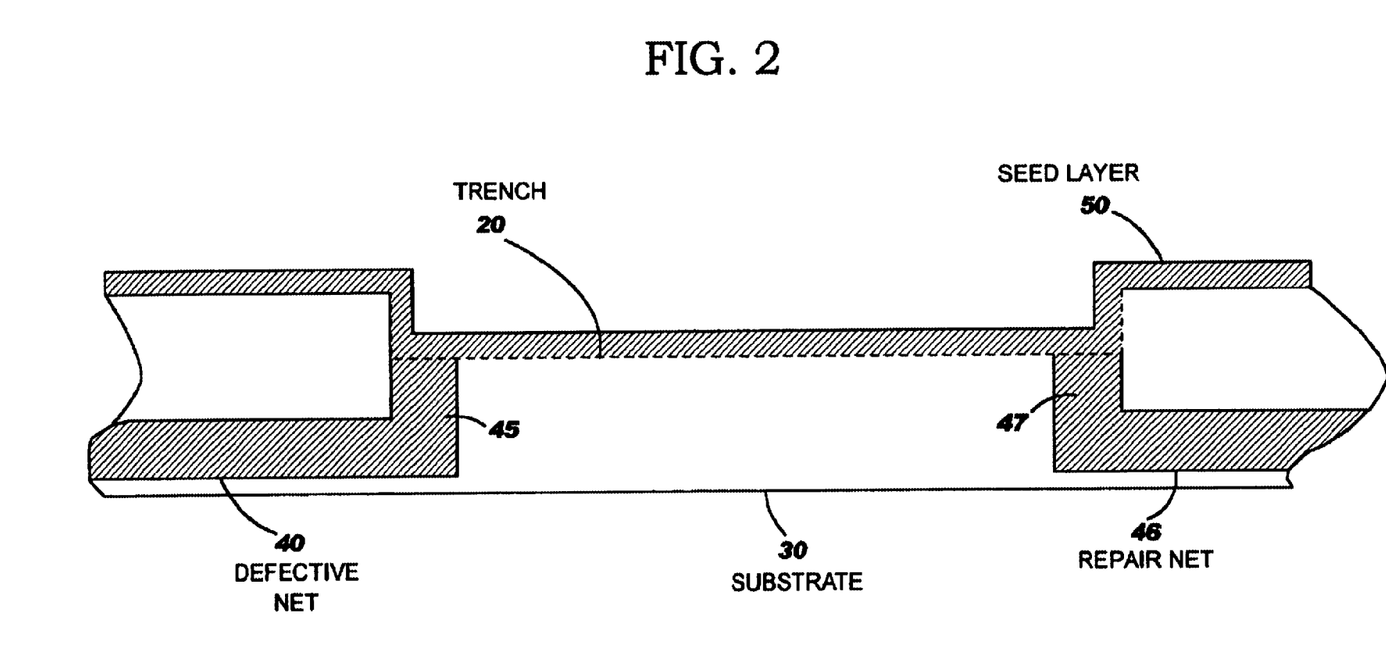
FIG. 2 is an enlarged, partial cross-sectional view of a substrate illustrating the deposition of a seed layer in the repair path.

The above described embodiments will now be described in more detail with reference to the accompanying figures. Referring to FIG. 1, a laser beam 10 is used to form a trench 20 on the surface 25 of a substrate 30. This trench 20 defines the path of a desired repair conductor from a defective net 40 and defective net via 45 to an alternate repair net 46 and repair net via 47. In a preferred embodiment the trench is approximately 40 $\mu$m in width and approximately 18 $\mu$m in depth. Once the trench 20 is formed, a seed layer 50, shown in FIG. 2, is evaporated or preferably sputtered, covering at least a portion of the surface of the substrate and subsequently the bottom and sides of the laser formed trench 20. This seed layer provides adhesion of the repair metallurgy to the repair path side-walls as well as an electrically conductive path to the edge of the substrate 30 for connection to the plating potential required for subsequent electroplating steps.

Figure 3:
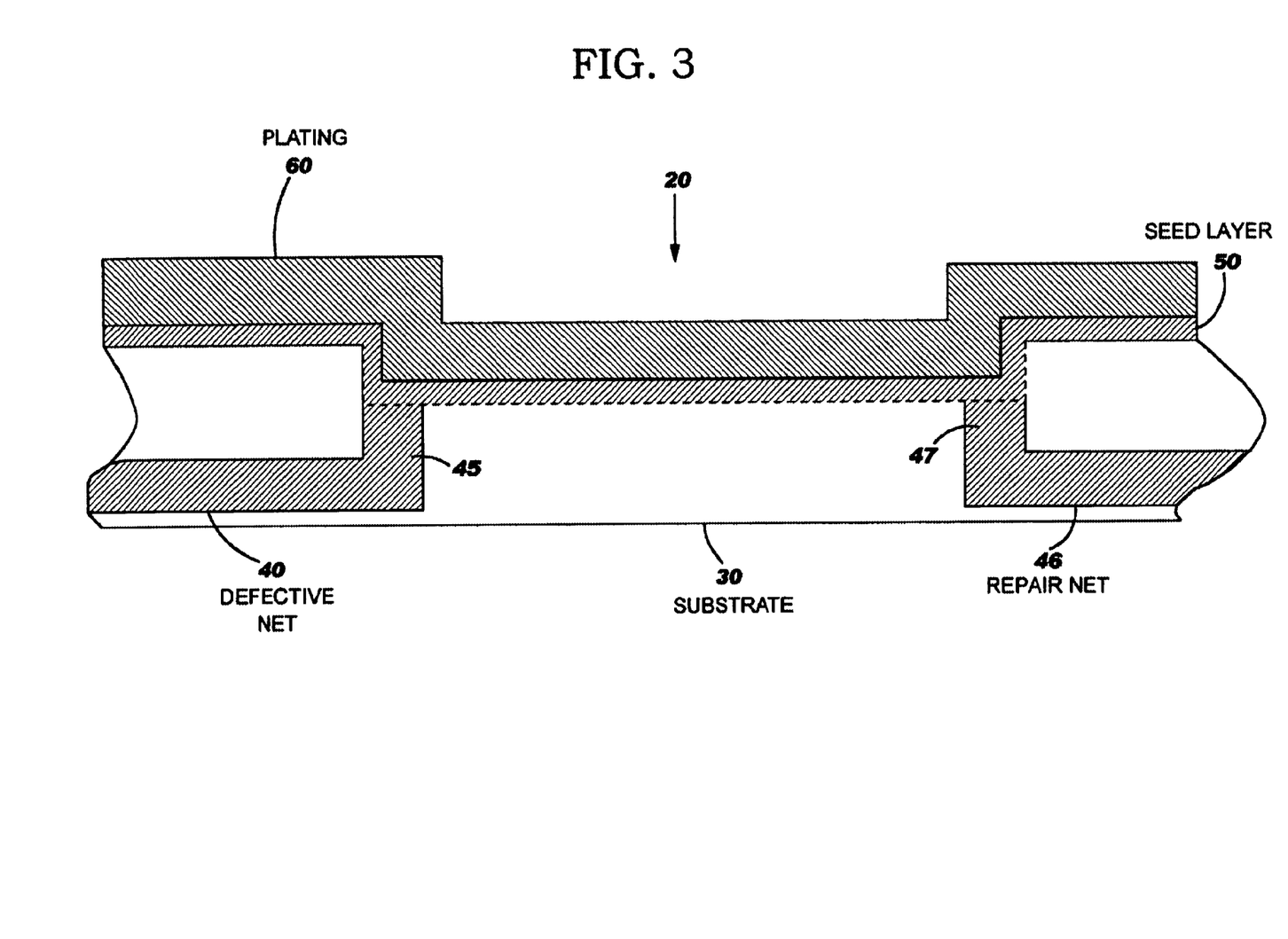
FIG. 3 is an enlarged, partial cross-sectional view of a substrate illustrating the deposition of conductive metal in the repair path.
Figure 4:
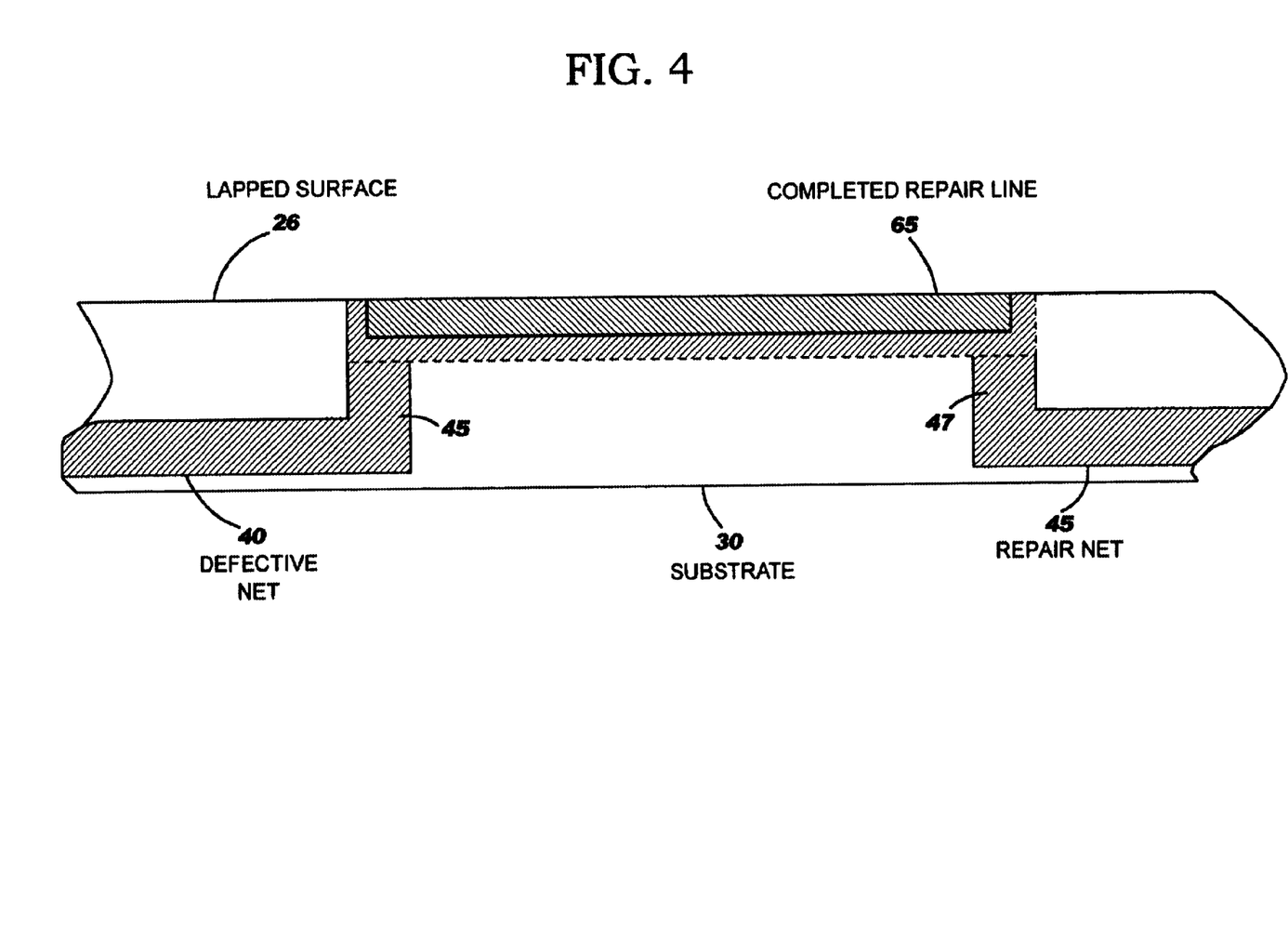
FIG. 4 is an enlarged, partial cross-sectional view of a substrate illustrating the removal of excess metal from the polished surface of the substrate.

The trench 20 is then completely filled by either continued sputtering of the desired metallurgy, or preferably, electroplated as shown in FIG. 3. The added metallurgy 60 is formed on at least a portion of the surface of the substrate 30 as well as in the laser formed trench 20, at the full thickness required to fill the trench, thus, the substrate 30 must be lapped and polished to remove the undesired metallurgy residing on the surface of the polished substrate 26 to expose and isolate just the repair conductor metallurgy 65 in the now filled trench as shown in FIG. 4. The requirement, however, that the substrate be planarized (lapped and/or polished) presents several required, but potentially damaging and costly process steps, and introduces other defects on the surface of the substrate which must be addressed.

Figure 5:
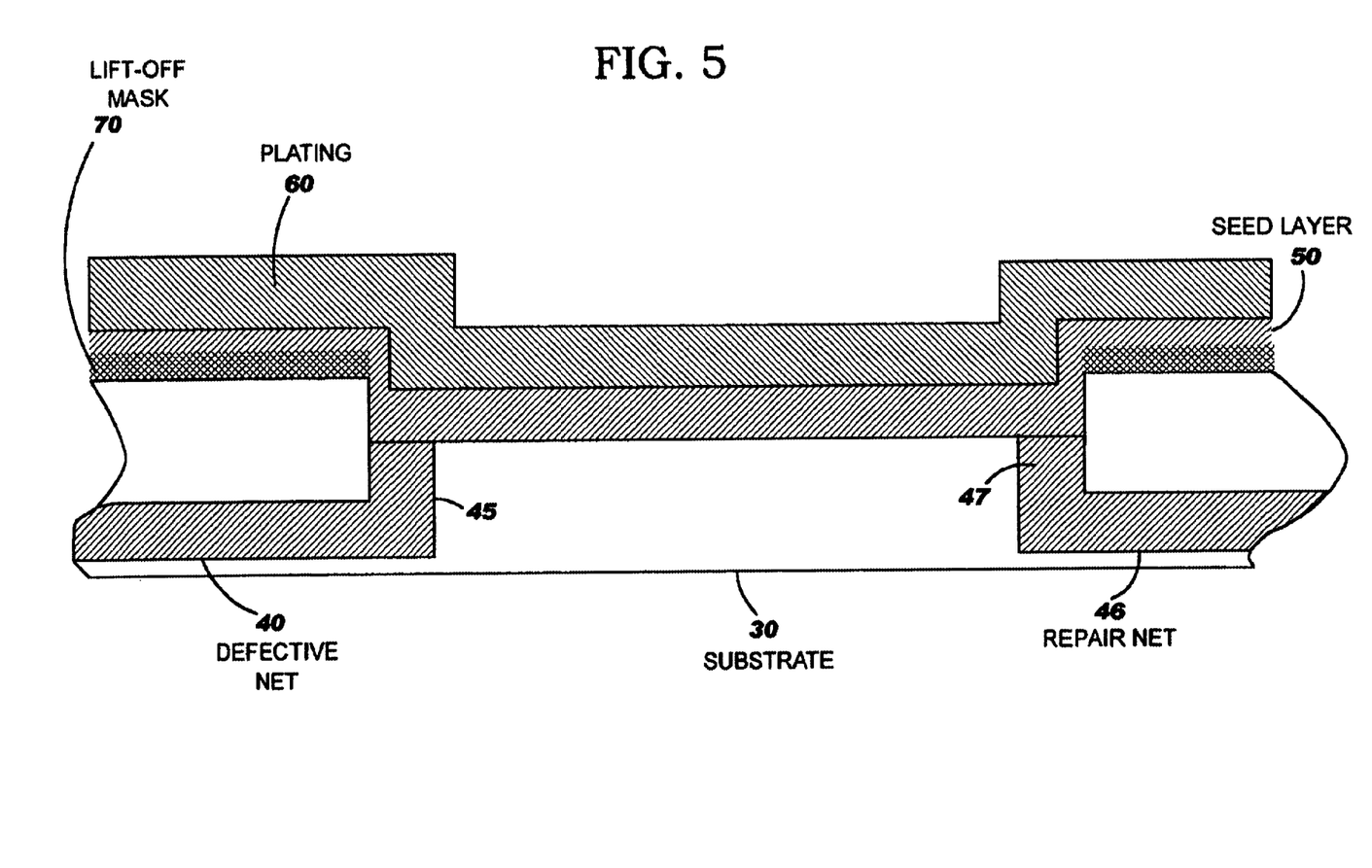
FIG. 5 is an enlarged, partial cross-sectional view of a substrate illustrating the deposition of conductive metal through a lift-off mask on the surface of the substrate.

Attempts to create repairs on non-planar substrates by using an in-situ lift-off mask have been unsuccessful. An example is illustrated in FIG. 5. A lift-off mask 70 consisting of a protective adhesive tape is placed on the surface of the substrate 30. A laser beam is used to form an opening through the lift-off mask and a corresponding trench 20 on the surface 25 of the substrate 30. As above, the trench 20, through the protective tape 70 and into the surface of the substrate, defines the path of a desired repair conductor from an isolated defective net via 45 to an alternate repair net via 47. The lift-off mask 70 is left in place when the substrate 30 is seeded and plated. This allows the trench to be filled with the conductor metallurgy 60 without plating the remaining surface of the substrate.

Consequently, the lift-off mask 70 is now completely covered by a thick layer of sputtered, evaporated or preferably electroplated metal 60 and subsequently will be fully attached to the repair path metallurgy by the full thickness of the metal. This causes removal of the lift-off mask 70 to be extremely difficult and/or impossible without damaging or removing the desired repair conductor metallurgy. It is therefore desirable to have a method to remove the lift-off mask 70 following just the seeding operation, but the seeding metallurgy 50 serves as the conductive path from the repair site to the edge of the substrate where the connection for the electroplating operation must be made.

Figure 6:
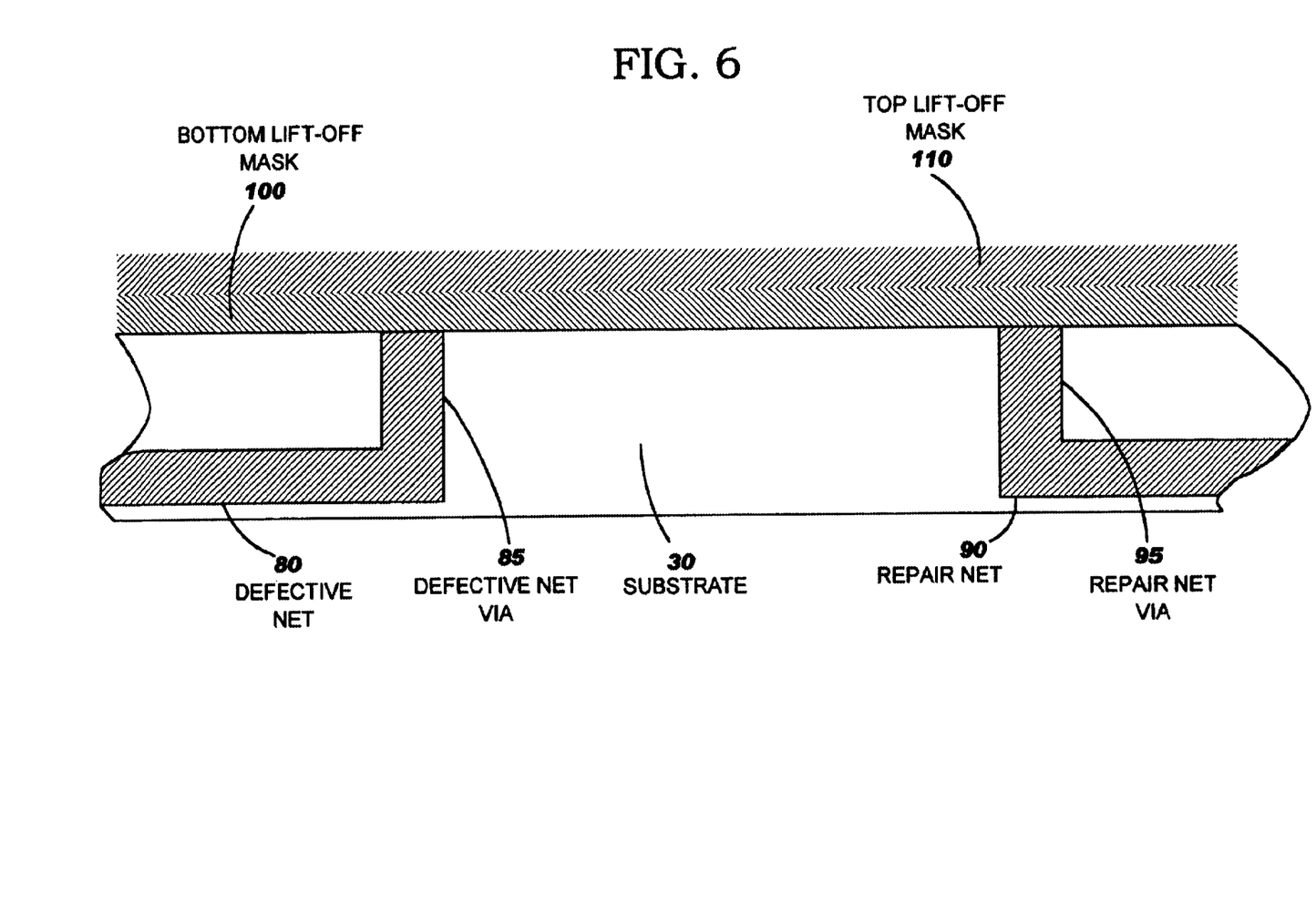
FIG. 6 is an enlarged, partial cross-sectional view of a substrate illustrating the application of a bottom and top lift-off mask on the surface of the substrate.

The current invention addresses a means to provide a repair conductor on a non-planar substrate without the above difficulties. Referring to FIG. 6 there is shown a cross sectional view of a defective net 80 connected to a defective net via 85, a repair net 90 connected to a repair net via 95, both contained within a MLC substrate 30. Two layers of a protective adhesive tape consisting of a bottom layer lift-off mask 100 and a top layer lift-off mask 110 are placed on top of the substrate 30. These layers of tape form a bottom and top lift-off mask respectively.

Figure 7:
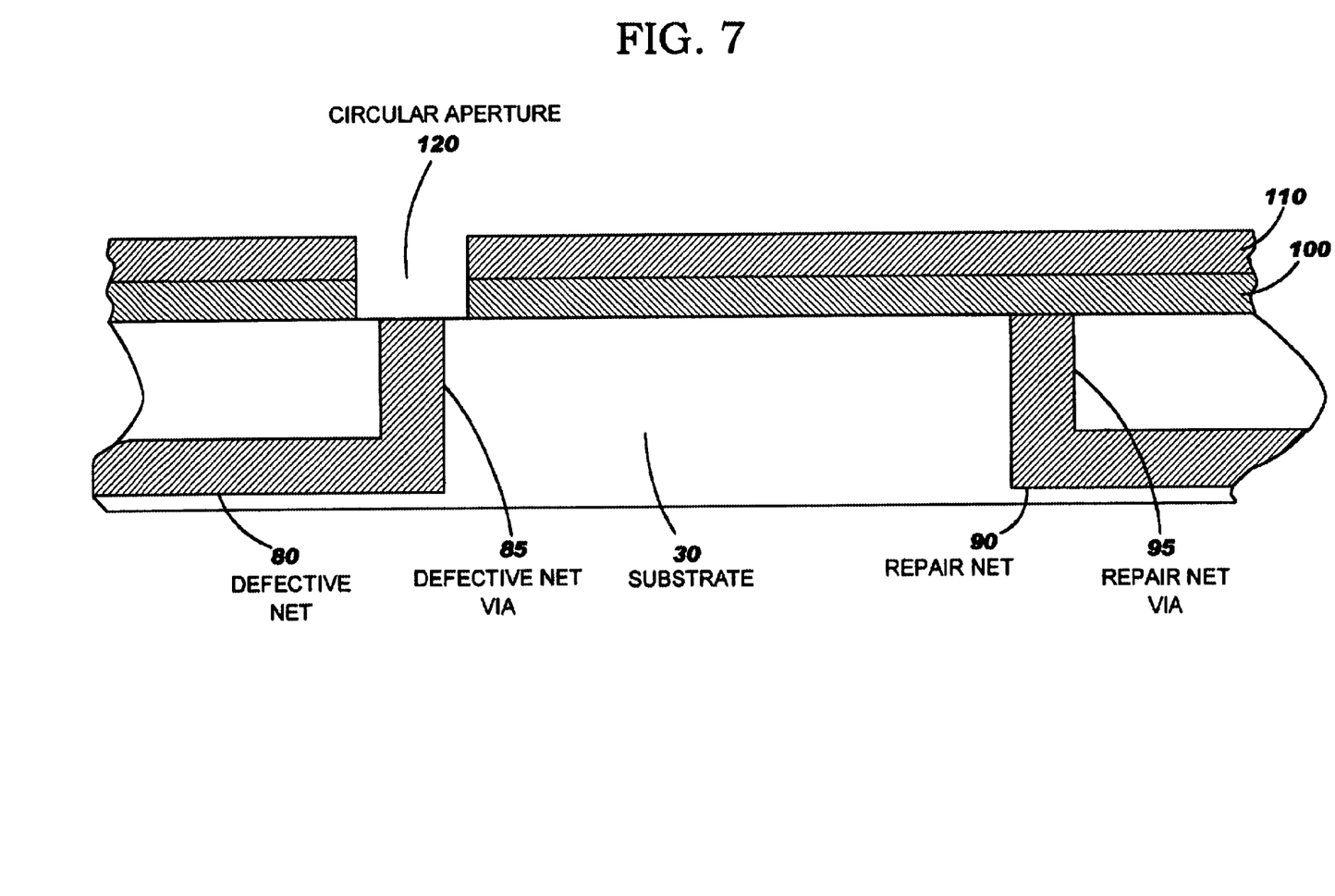
FIG. 7 is an enlarged, partial cross-sectional view of a substrate illustrating laser ablation over a defective net via.

Referring now to FIG. 7, a tightly focused laser beam, preferably an ultraviolet laser beam having a wavelength of 0.266 $\mu$m, is used to ablate an opening 120, typically a circular opening, in both layers of tape 100, 110 over the defective net via 85 connected to the defective net 80. The fluence (energy per unit area) of the laser is adjusted so that it ablates the tape 100, 110 but does not affect the underlying ceramic substrate 30 or metallurgy. Suitable laser parameters in a preferred embodiment used a power of 0.01 mW at 1 KHz and approximately 200 nano-second pulse widths. The diameter of the hole 120 in the lift-off mask is preferably larger than the via 85 to allow an etchant solution to reach the via metallurgy. For a via diameter of approximately 0.004 inches the diameter is preferably about 0.010 inches.

Figure 8:
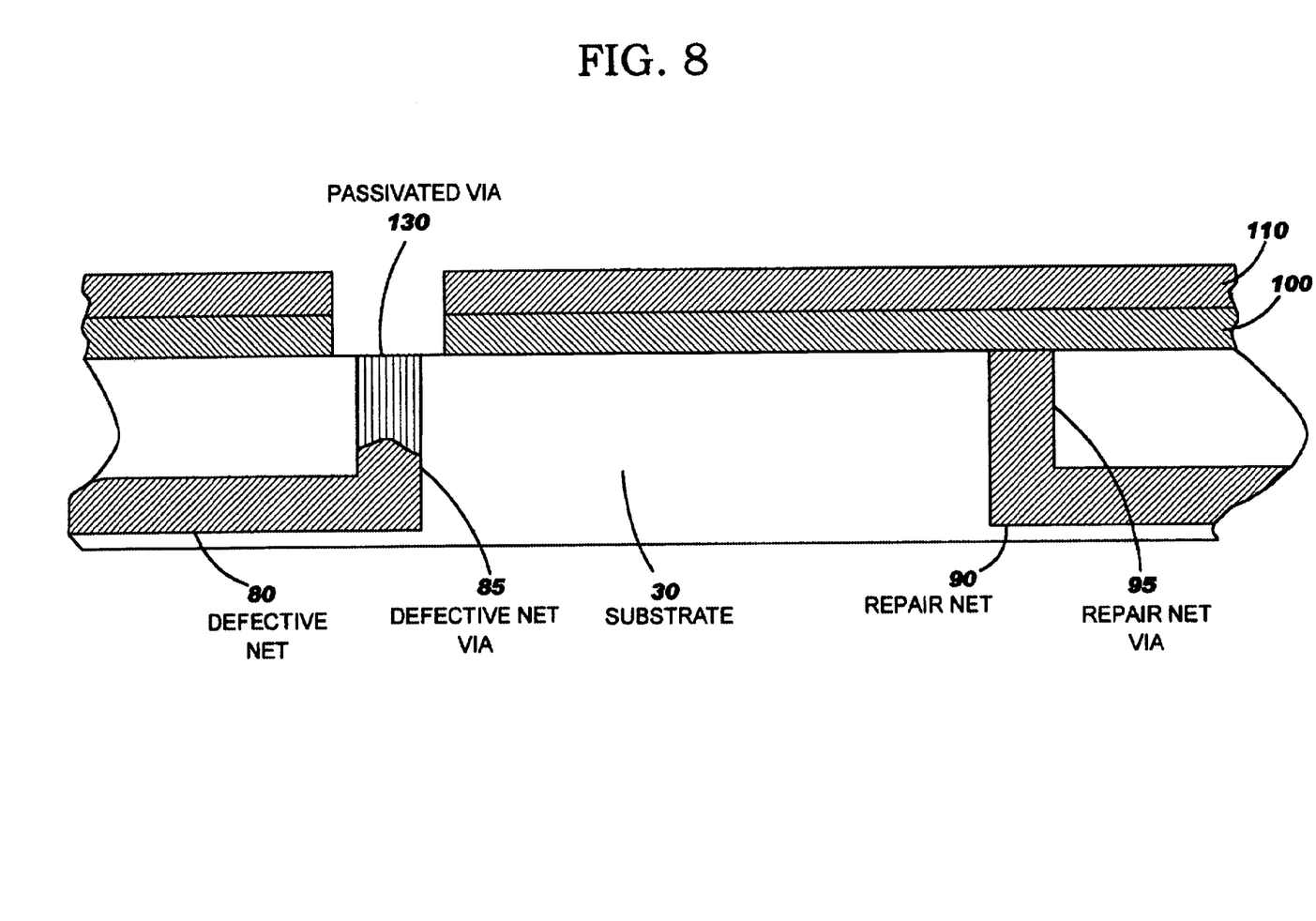
FIG. 8 is an enlarged, partial cross-sectional view of a substrate illustrating via passivation.

In a preferred embodiment the etchant is an acid solution. An example is an acid solution of approximately 50% nitric acid. The etchant is then applied to the ablated area over the defective net via 85, dissolving a portion of the via metallurgy to below the surface of the ceramic 30. As an example, a typical etch depth is approximately 60 μm deep. The etchant is completely rinsed, preferably with distilled or de-ionized water, and passivation material 130 is deposited in the etched via 85 to ensure electrical isolation of the defective net 80 as shown in FIG. 8.

Figure 9:
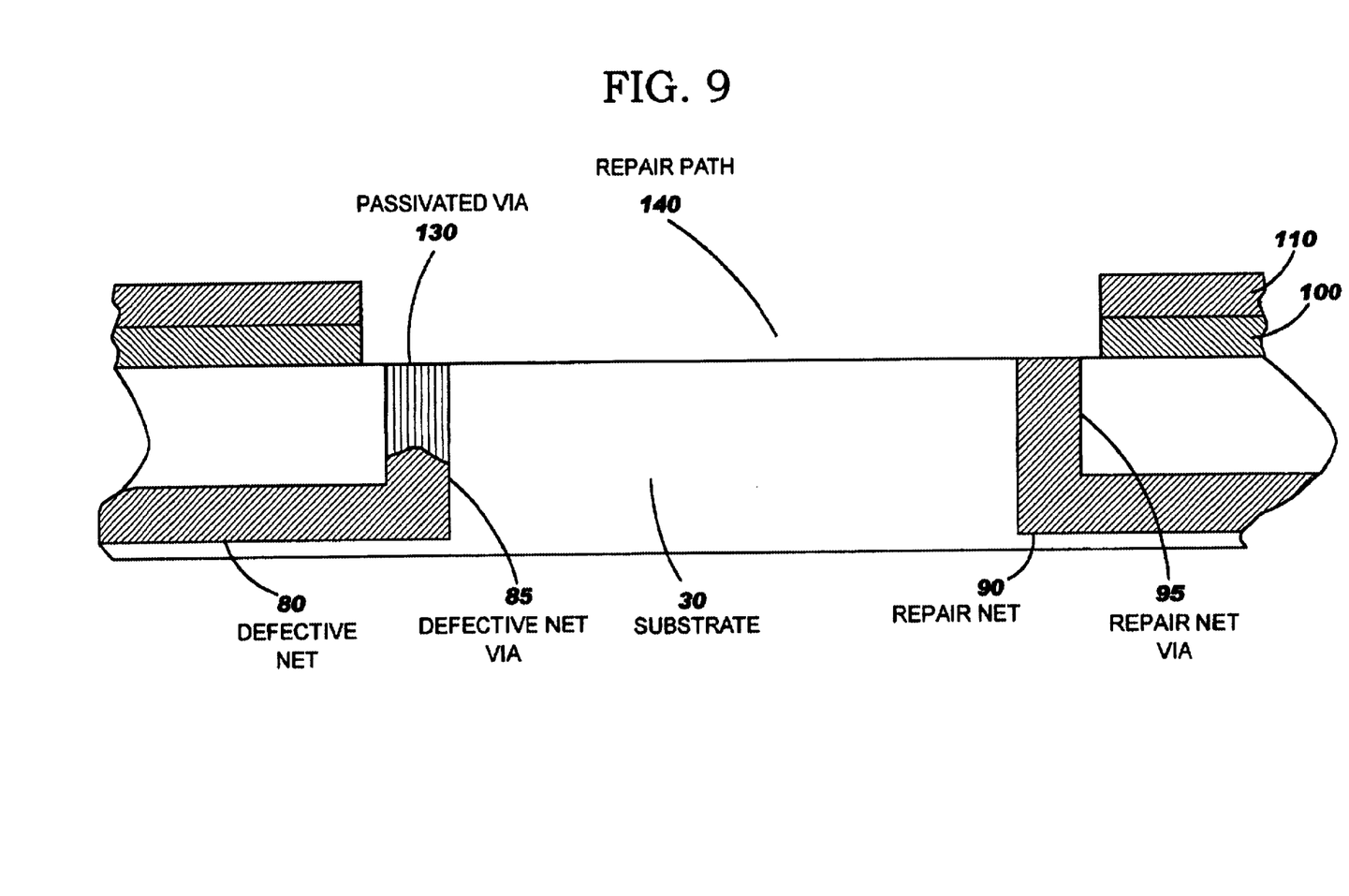
FIG. 9 is an enlarged, partial cross-sectional view of a substrate illustrating a repair path.

The laser beam is again used to ablate a path completely through both tape layers 100, 110 from the now electrically isolated defective net via 85 to an electrically good repair net via 95. This path, as shown in FIG. 9, provides a repair path 140 on the surface of the substrate through which metal will be sputtered or otherwise deposited to create a repair.

Figure 10:
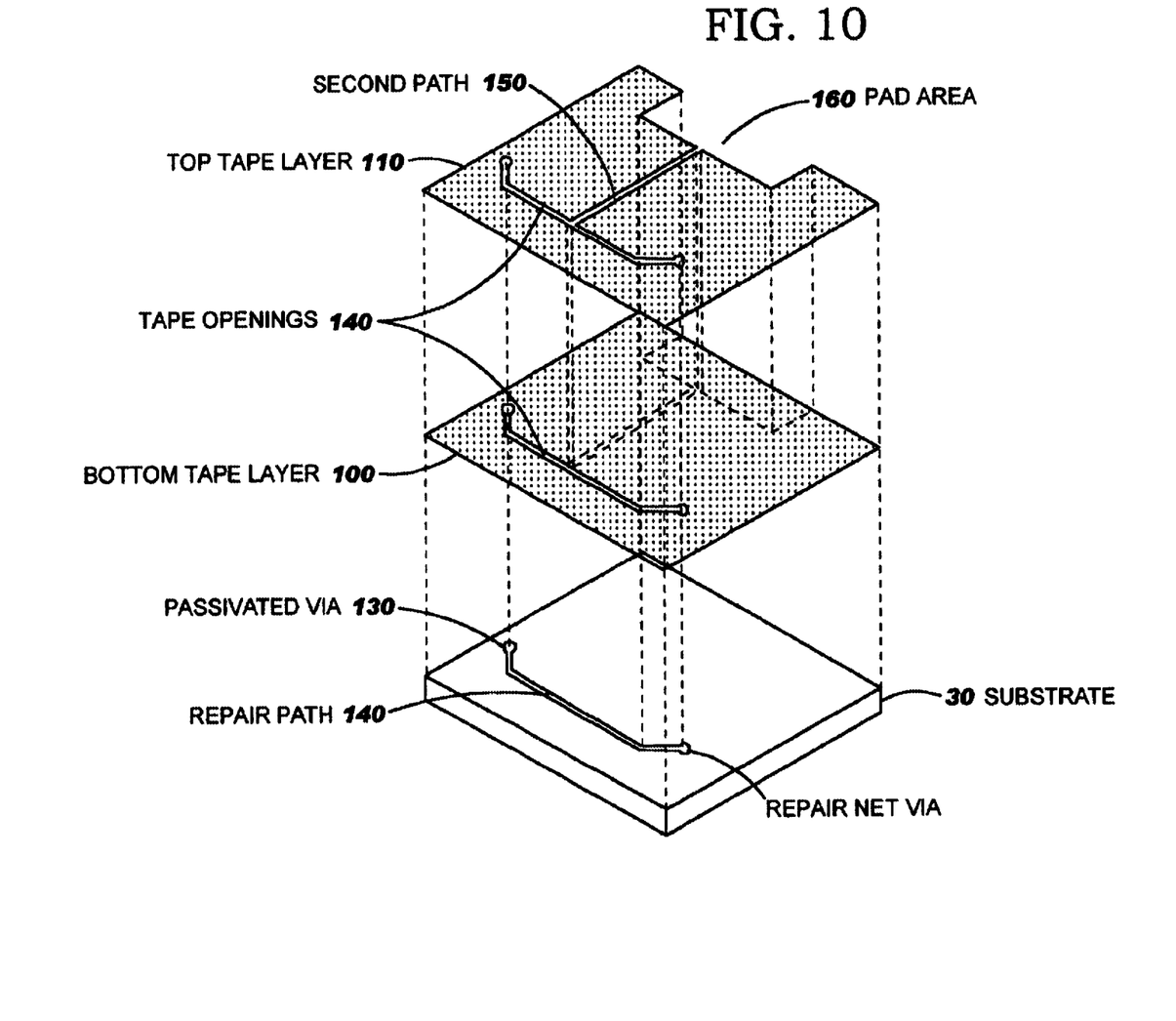
FIG. 10 is an exploded isometric view illustrating the formation of a second path in the top lift-off mask.

Referring now to the exploded isometric view shown in FIG. 10, the laser fluence is then reduced such that the laser beam only removes a single layer of protective tape 110. (Suitable laser parameters in a preferred embodiment used a power of 0.02 mW at 1 KHz and approximately 200 nano-second pulse widths.) This can be done in a single pass or in several passes to ablate only through the top layer of tape 110 to form a second path 150. The second path 150 is formed so that the top tape layer 110 is fully removed exposing the bottom layer of tape 100. This second path 150 is routed from at least one arbitrary point along the desired repair path 140 to a portion of the edge of the substrate 30 and preferably to a pad area 160 where contact will be made for electroplating the repair path 140.

Figure 11:
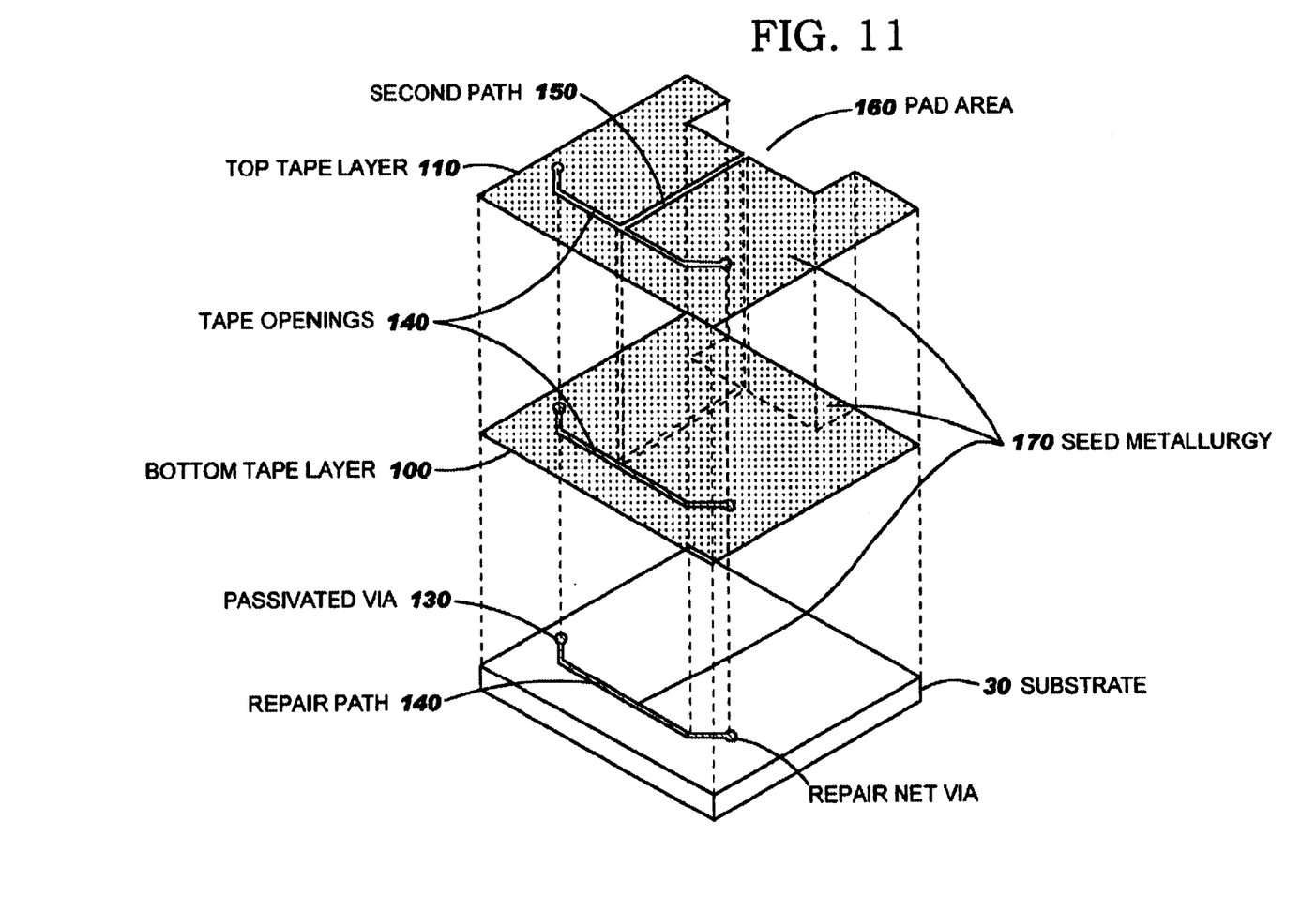
FIG. 11 is an exploded isometric view illustrating the deposition of seed metallurgy.
Figure 12:
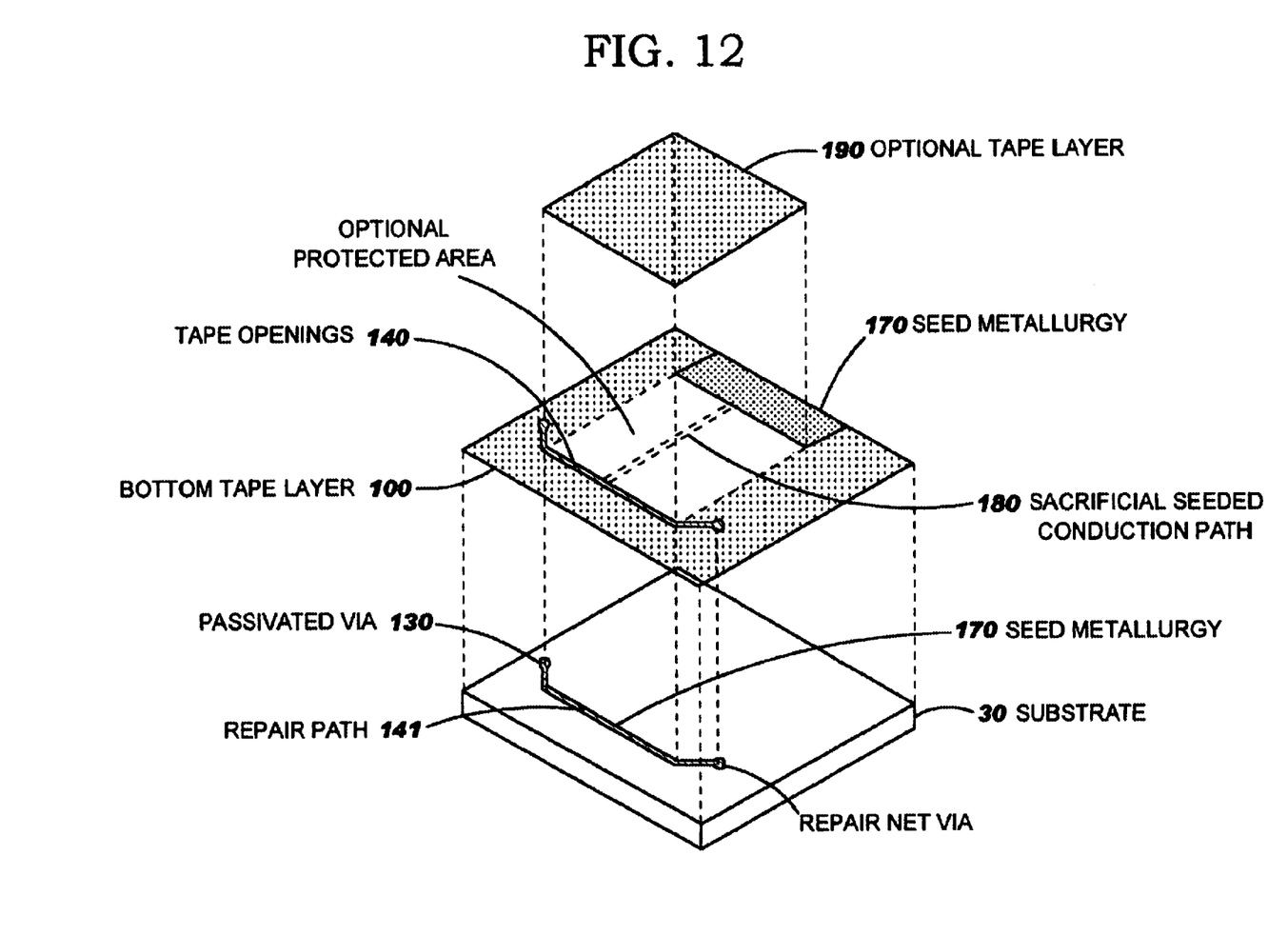
FIG. 12 is an exploded isometric view illustrating the removal of the of the top lift-off mask.

Referring now to FIG. 11, seed metallurgy 170 is then sputtered or evaporated over the surface of the top mask 110 and into the openings formed by the laser. The seed metallurgy goes into the second path on top of layer 100, and also into the repair path 140 on the substrate surface. At this point, the upper layer of tape 110 can now be removed as shown in FIG. 12, resulting in a seeded repair path 141 on the surface of the substrate 30 and a sacrificial seeded conduction path 180 which is used for connecting the seeded repair path 141 to the electroplating potential which is supplied to the pad area 160. The sacrificial seeded conduction path 180 is formed so that its width is narrow (typically 10–25% of the repair metallurgy width) in relation to the width of the repair or if desired, an optional new piece of tape 190 can be applied over this sacrificial line leaving just its ends exposed, preventing the bulk of the line length from plating-up.

The part can now be electroplated in a plating solution by connecting the end of the sacrificial conduction path 180 at the pad area 160 to the plating potential. The current (typically micro amps) is conducted through this path 180 through the sputtered seed layer 170 to the repair path 140 wherein only the repair path 140 and whatever exposed sacrificial seeded conduction path will plate-up.

Since the sacrificial seeded conduction path 180 is formed only on the surface of the first layer of tape 100 and can be of very narrow width, or be optionally covered by an additional layer of tape 190 to prevent plating, only the small exposed area of this sacrificial line will plate up along with the repair path area. The small cross sectional area of this line allows for easy separation of the first layer of tape 100 with its sacrificial seeded repair path without pulling or otherwise damaging the desired repair metallurgy on the repair site. It is also beneficial, that the plated area be limited to only the exposed seeded area and not the entire top surface of the substrate as shown in the prior art. This reduces the quantity of costly plating solution consumed in the electroplating step.

The resulting repair conductor can then be further processed (i.e., passivated, heat treated, or gold plated) as desired to complete the repair. Although a laser has been used as a preferred method for creating the apertures in the protective tape, other methods such as reactive ion etching through a mask, engraving, cutting, sand blasting etc., can be used where applicable.

In a second embodiment of the present invention, the above process is performed without the acid etching of vias to form an EC wire. In a third embodiment of the present invention, after acid etching the defective net via, the laser fluence is increased (suitable laser parameters in a preferred embodiment used a power of 0.14 mW at 1 KHz and approximately 200 nano-second pulse widths) so that as the tape is ablated over the desired repair path, and a portion of the underlying ceramic is also removed to form a trench below the surface of the ceramic. Metallization and mask removal can then be done in the same manner as in the first embodiment. Forming a trench in the surface of the substrate allows the new metallization to be thicker without increasing its height above the surface of the substrate, ensuring adequate conductance of the metal line while maintaining low line height.

While the preferred embodiments described above relate to electrical repair/EC metallurgy on ceramic substrates, this technique can also be utilized on any of a variety of substrates such as plastic, fiberglass, glass, stone, etc. The above processes can also be used for cosmetic purposes, for example, placing logo's, initials, inscriptions, or decorations on items such as on the surface of eyeglasses, wrist and pocket watches, picture frames, or any item where fine metallurgy would be applied to a surface. It should also be known that although the preferred embodiments allow the utilization for repair of non-planarized substrates, the knowledge can also be easily applied to substrates which are planarized, and in some instances can present a significant cost savings over alternate methods.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to form surface plating metallization on a substrate comprising the steps of:

provided a substrate having a top surface and a bottom surface and a plurality of conductive vias providing electrical connections between said top and bottom surface and between top surface vias;

applying a first layer of tape on said top surface;

applying a second layer of tape on said first layer of tape;

creating a first path through both said first layer of tape and said second layer of tape to expose a portion of said top surface, said first path contacting at least one conductive via on said top surface;

creating a second path through said second layer of tape to expose a portion of said first layer of tape and intersecting with said first path wherein said second path is connected from said first path to an edge of the substrate;

depositing a seed layer over the surface of said second layer of tape to create a seeded plating path in said first path and a sacrificial seeded conduction path in said second path intersecting with the seeded plating path;

removing said second layer of tape while maintaining a seeded plating path in said first path and a sacrificial seeded conduction path on the surface of said first layer of tape;

connecting said sacrificial seeded conduction path to a plating potential at the edge of the substrate;

immersing said substrate in a plating solution and applying current through the sacrificial seeded conduction path to plate the seeded plating path;

and removing said first layer of tape to remove the sacrificial seeded conduction path and uncovering a selectively plated substrate surface.

2. The method of claim 1 further comprising the steps of:

applying a third layer of tape over said sacrificial seeded conduction path prior to plating such that only the ends of said sacrificial seeded conduction path are exposed to prevent the bulk of said sacrificial seeded conduction path from plating.

3. The method of claim 1 wherein said first and second layers of tape are a transparent polyester film with a rubber adhesive.

4. The method of claim 3 wherein said first and second layers of tape are approximately 0.0014 inches thick respectively.

5. The method of claim 1 wherein said first and second paths are created by a laser.

6. The method of claim 5 wherein said laser is operating on an ultra violet wavelength.

7. The method of claim 6 wherein said UV laser is a Nd-YAG laser having a wavelength of approximately 0.266 $\mu$m.

8. The method of claim 1 wherein said seed layer is deposited by sputtering.

9. The method of claim 1 wherein said seed layer is deposited by evaporation.

10. The method of claim 1 wherein said first and second paths are created by reactive ion etching.

11. The method of claim 1 wherein said first and second paths are created by engraving.

12. The method of claim 1 wherein said first and second paths are created by cutting.

13. The method of claim 5 wherein said laser also forms a trench in said top surface coinciding with said first path.

* * * * *